United States Patent

Ham

[11] Patent Number: 6,114,897
[45] Date of Patent: Sep. 5, 2000

[54] LOW DISTORTION COMPENSATED FIELD EFFECT TRANSISTOR (FET) SWITCH

[75] Inventor: Ronald E. Ham, Austin, Tex.

[73] Assignee: Cisco Technology, Inc., San Jose, Calif.

[21] Appl. No.: 09/178,472

[22] Filed: Oct. 22, 1998

[51] Int. Cl.[7] .................................................. H03K 17/687
[52] U.S. Cl. ........................... 327/427; 327/434; 327/543
[58] Field of Search ..................................... 327/427, 436, 327/431, 432, 434, 437, 534, 535, 538, 541, 542, 543

[56] References Cited

U.S. PATENT DOCUMENTS

| 5,563,545 | 10/1996 | Scheinberg | 327/389 |
| 5,617,057 | 4/1997 | Rees et al. | 327/543 |
| 5,714,905 | 2/1998 | Galli et al. | 327/538 |

Primary Examiner—Terry D. Cunningham
Assistant Examiner—Quan Tra
Attorney, Agent, or Firm—Baker Botts L.L.P.

[57] ABSTRACT

An electronic switch is disclosed that comprises a switch element and compensation circuitry. The switch element is operable to pass a signal between signal terminals responsive to a voltage applied to its control terminal. The compensation circuitry applies a bias voltage to the control terminal that tracks an average of a voltage at the signal terminals and is offset by a substantially constant voltage magnitude. The bias voltage insures a substantially uniform resistance across the switch element as the signal varies. In one implementation, the switch element is a field effect transistor. Further, in another embodiment, compensation circuitry can be coupled to a backgate of the switch element. In this case, the compensation circuitry can apply a bias voltage to the backgate that tracks an average of the voltage at the signal terminals and is offset by a substantially constant voltage magnitude. The second bias voltage offsets the backgate to back bias the backgate to channel semiconductor junction.

13 Claims, 5 Drawing Sheets

- ○ V(OUT,IN)/I(R10)
- ◇ 0.5*V(OUT,IN)/ID(MN2b)
- □ 0.5*V(OUT,IN)/ID(MN1b)

- ─□─ V(OUT,IN)/I(R14)

- ─□─ V(IN)
- ─◇─ V(OUT)
- ─▽─ V(GATE)
- ─── V(BACKGATE)

LOW DISTORTION COMPENSATED FIELD EFFECT TRANSISTOR (FET) SWITCH

TECHNICAL FIELD OF THE INVENTION

This invention relates in general to the field of electronic circuits and devices and, more particularly, to a low distortion compensated field effect transistor (FET) switch.

BACKGROUND OF THE INVENTION

In general, a field effect transistor (FET) switch functions by receiving a control (or gate) bias which is sufficient to cause the FET channel to conduct in an "on" state and not to conduct in an "off" state. Such switches can be constructed, for example, using metal oxide semiconductor field effect transistors (MOSFETs), junction field effect transistors (JFETs) and metal-semiconductor field effect transistors (MESFETs). In operation, with no gate bias with respect to the source and drain of the FET, the channel of the FET does not conduct as the channel is depleted of carriers. In the case of an n-channel device, for example, this means that there are no excess electrons to facilitate the transport of a current. For an n-channel device, a positive potential with respect to the channel (at source and drain potential) can be applied to the gate, and the channel carriers (e.g., electrons) are enhanced. The channel resistivity is modulated by the magnitude of the difference between the source and drain potential and the controlling gate potential. The greater the difference, the more the conductivity of the channel is enhanced up to a value determined by the doping density of the N-type channel semiconductor.

An FET switch can be used in discrete and integrated circuits as voltage controlled switches either connecting or disconnecting the source from the drain of the FET device. For example, a signal to be switched can be connected to the source, and a fixed bias potential can be placed on the gate to control the connection. (It should be noted that, in a device that is axially symmetrical, the designation of source and drain is arbitrary.) In the case of a time-varying signal, as the voltage magnitude of the signal applied to the source varies, it varies the bias potential difference between the source and the gate. This modulates the resistance of the channel between the source and drain.

Placing a resistive load from the drain to signal ground will cause a current to flow through the FET channel. However, as the channel resistance is modulated by the applied source signal, a wave form that is not an exact duplicate of the applied signal wave form can appear across the load resistor. The result is an output wave form that contains intermodulation products of the input signal. This distortion limits the dynamic range of the signal passing through the FET switch and hence limits the amount of information that can be switched through the FET switch device. Typically, such distortion caused by channel conductivity modulation is greater in metal oxide semiconductor (MOS) devices than in junction devices because the complex nature of the gate oxide produces a high order of non-linearity. In the JFET, the conductivity approximates a squared function of the applied gate-source voltage. However, in the MOSFET, this relation contains higher order non-linearities as evidenced in a Voltera series of its transfer function. This causes even relatively narrow band signals to be distorted by third, fifth and seventh order intermodulation products.

There are conventional methods for decreasing distortion in the output waveform of a switch that involve paralleling N-channel and P-channel devices. For example, a single N-channel FET can be used as a switch, but as the channel to gate voltage decreases with increased input voltage, the channel resistance will increase due to decreased carrier enhancement. A P-channel FET, requiring a negative gate bias to turn the channel "on", displays the same behavior with the resistance increase occurring with an increased negative input voltage. The paralleling of an N-channel and a P-channel device can decrease the resistance curvature about zero volts, and thus decrease the distortion in the output waveform of the switch. This paralleling can result in reducing the slope of the resistance versus input voltage to approximately zero thus minimizing the distortion in the voltage range around zero. However, compensation of the resistance curve over a wide range of input voltages is not possible with such a design.

It would be advantageous to provide a low distortion field effect transistor switch which allows a wide range of signals to be switched while reducing or eliminating the negative effects of intermodulation in the output signal.

SUMMARY OF THE INVENTION

In accordance with the present invention, a low distortion compensated field effect transistor switch is disclosed which provides significant advantages over conventional field effect transistor switches.

According to one aspect of the present invention, an electronic switch is disclosed that comprises a switch element and compensation circuitry. The switch element is operable to pass a signal between signal terminals responsive to a voltage applied to its control terminal. The compensation circuitry applies a bias voltage to the control terminal that tracks an average of a voltage at the signal terminals and is offset by a substantially constant voltage magnitude. The bias voltage insures a substantially uniform resistance across the switch element as the signal varies. In one implementation, the switch element is a field effect transistor.

Further, according to another aspect, compensation circuitry can be coupled to a backgate of the switch element. In this case, the compensation circuitry can apply a bias voltage to the backgate that tracks an average of the voltage at the signal terminals and is offset by a substantially constant voltage magnitude. The second bias voltage offsets the backgate to back bias the backgate to channel semiconductor junction.

A technical advantage of the present invention is the application of voltages to the gate and backgate of a switch element to make more uniform the resistance across the switch for changes in the input signal. The applied voltages can thereby reduce intermodulation distortion in the output signal of the switch.

Another technical advantage of the present invention is the ability to decrease the size and increase the integration of a field effect transistor switch while also reducing intermodulation. The switch provides more uniformity in switch resistance which reduces intermodulation within the device. Reduction of the total transistor area by elimination of the low carrier mobility P-channel device reduces switch parasitic capacitance.

Other technical advantages of the present invention should be apparent from the drawings, specification and claims.

BRIEF DESCRIPTION OF THE DRAWINGS

A more complete understanding of the present invention and advantages thereof may be acquired by referring to the following description taken in conjunction with the accompanying drawings, in which like reference numbers indicate like features, and wherein.

DETAILED DESCRIPTION OF THE INVENTION

Figure 1:
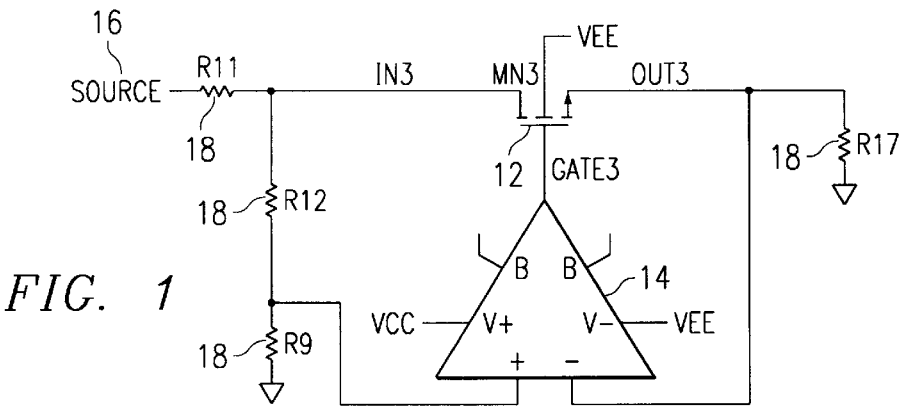
FIG. 1 is a circuit diagram of one embodiment of a self-balancing bridge measurement circuit.

FIG. 1 is a circuit diagram of one embodiment of a self-balancing bridge measurement circuit. As shown, this circuit includes a field effect transistor (FET) 12 having its gate connected to the output of an operational amplifier 14. The power supplies of operational amplifier 14 are connected to a positive power supply ($V_{CC}$) and ground potential in the ($V_{EE}$). The backgate of field effect transistor 12 is also connected to ground potential ($V_{EE}$). A signal source 16 provides a signal to the circuit through a first resistor 18. Additional resistors 18, including a load resistor, are connected as shown.

In operation, the circuit of FIG. 1 implements a self-balancing bridge measurement circuit. The operational amplifier 14 forces the ratio of resistor R9 to resistor R12 to be equal to the ratio of resistor R17 to the channel resistance of field effect transistor 12. In the case of a uniformly doped channel in field effect transistor 12, linearly sweeping the input voltage from signal source 16 results in a gate voltage that is a linear function of the input voltage. It should be noted that non-uniform doping in the channel of transistor 12 would require some non-linear shaping of the gate voltage to maintain a substantially consistent channel resistance.

Figure 2:
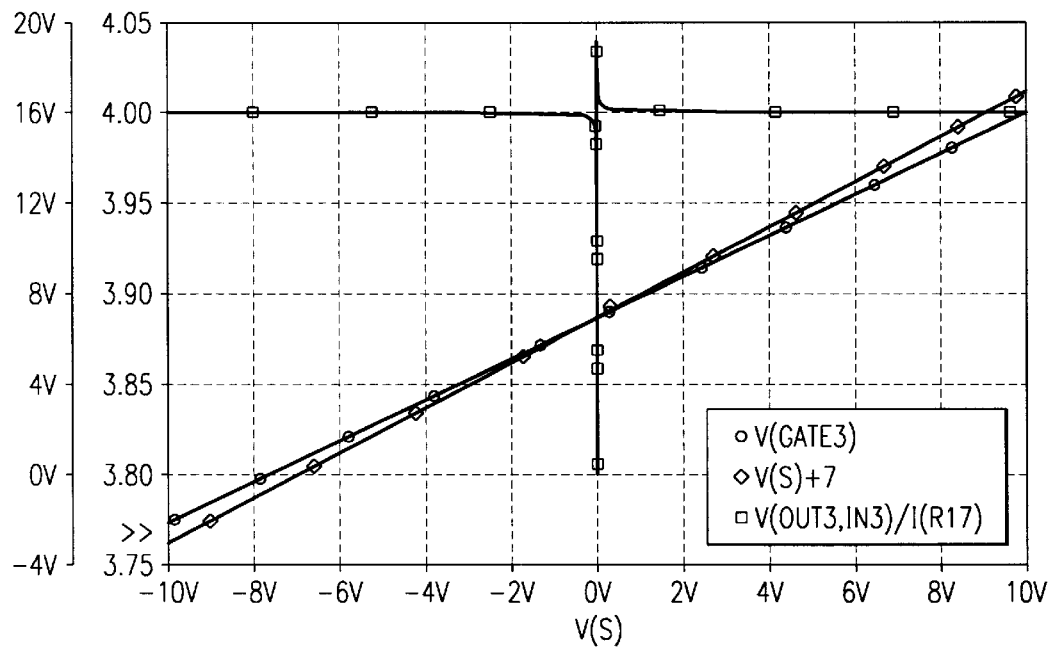
FIG. 2 is a diagram of a typical response of the circuit of FIG. 1.

FIG. 2 is a diagram of a typical response of the circuit of FIG. 1. As shown, FIG. 2 plots the voltage at the gate of field effect transistor 12, the voltage at the source and the channel resistance. From FIG. 2, it can be seen that the channel resistance remains substantially constant over the range of input voltages from signal source 16. Further, it has been shown that changing the load resistance, and hence the drain current, for various field effect transistors 12 yields consistent results with that shown in FIG. 2. These results generally follow the equation:

$$V(\text{gate}) = [V(\text{drain}) + V(\text{source})]/2 + K[V(\text{drain}) - V(\text{source})] + V(\text{offset}).$$

In this equation, K is a small positive or negative number with a magnitude generally less than 0.3, and V(offset) is the channel to gate voltage required to attain a specific on-resistance. The circuit of FIG. 1 and results of FIG. 2 validate that a bias circuit can compensate the switch for reasonable values of input voltage and load resistance to generate a relatively flat resistance response across ranges of input voltages.

Figure 3:
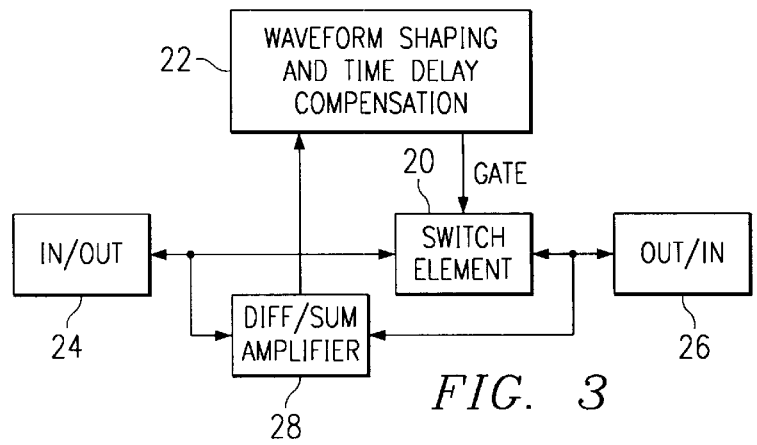
FIG. 3 is a block diagram of one embodiment of a compensated field effect transistor switch.

FIG. 3 is a block diagram of one embodiment of a compensated field effect transistor switch. As shown in FIG. 3, the circuit comprises a switch element 20 which can be a field effect transistor device as discussed above. Switch element 20 receives a control (gate) signal from wave form shaping and time delay compensation circuitry 22. Switch element 20 also receives a signal from in/out terminal 24 and connects/disconnects that signal to out/in terminal 26. As shown, difference/sum amplifier circuitry 28 is coupled to receive the input and output signals of switch element 20. In the case of a field effect transistor as switch element 20, this means that circuitry 28 is coupled to the drain and source of the field effect transistor. Circuitry 28 is coupled to and provides an amplified difference/sum signal to circuitry 22.

In operation, circuitry 28 and circuitry 22 of FIG. 3 operate to actively compensate the gate voltage of switch element 20 to insure consistent channel resistance for switch element 20 over reasonable values of input signals and load resistance. Although not shown, circuitry can also be used to compensate the backgate of switch element 20. The compensation can apply a bias voltage that tracks an average of a voltage at the signal terminals and is offset by a substantially constant voltage magnitude. In one embodiment, the substantially constant voltage magnitude is the voltage difference between the signal terminals. Further, the difference voltage can be summed with the average voltage for additional compensation for some non-symmetrical parasitics and non-uniform channel doping profiles. The bias voltage for the backgate (not shown) also can apply a voltage that tracks the average of the voltage at the signal terminals and is offset by a substantially constant voltage magnitude.

Figure 4:
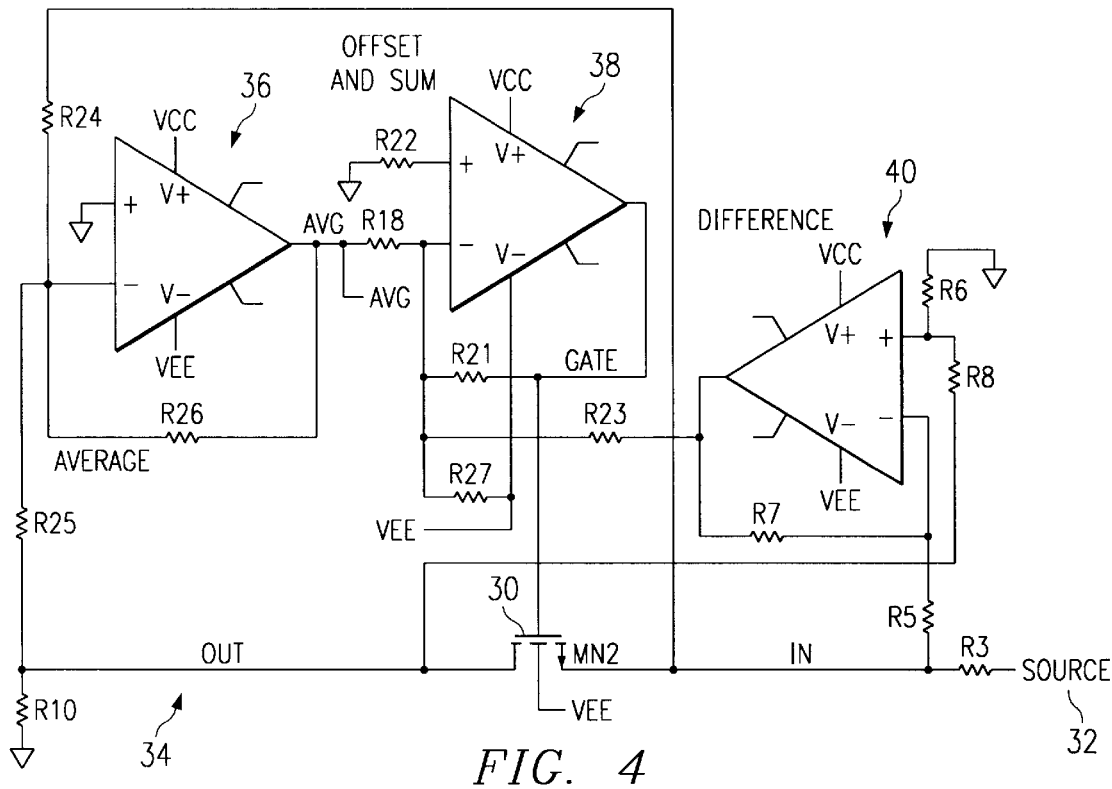
FIG. 4 is a circuit diagram of one embodiment of an implementation of the circuit of FIG. 3.

FIG. 4 is a circuit diagram of one embodiment of an implementation of the circuit of FIG. 3. As shown, the circuit of FIG. 4 has a switch element 30 which is a MOSFET having its backgate connected to the most negative potential in the circuit ($V_{EE}$). A signal source 32 provides a signal to the source of transistor 30, and the drain of transistor 30 is connected to node 34. Averaging circuitry 36 is coupled to receive both the input signal and output signal of transistor 30 provides an output signal to offset and sum circuitry 38. Offset and sum circuitry 38 also receives an output signal from difference circuitry 40 which receives the input and output signals of transistor 30. In operation, the circuit of FIG. 4 implements a field effect transistor switch in which the compensation of the gate voltage of transistor 30 insures substantially uniform channel resistance response across a range of input signals from signal source 32.

Figure 5:
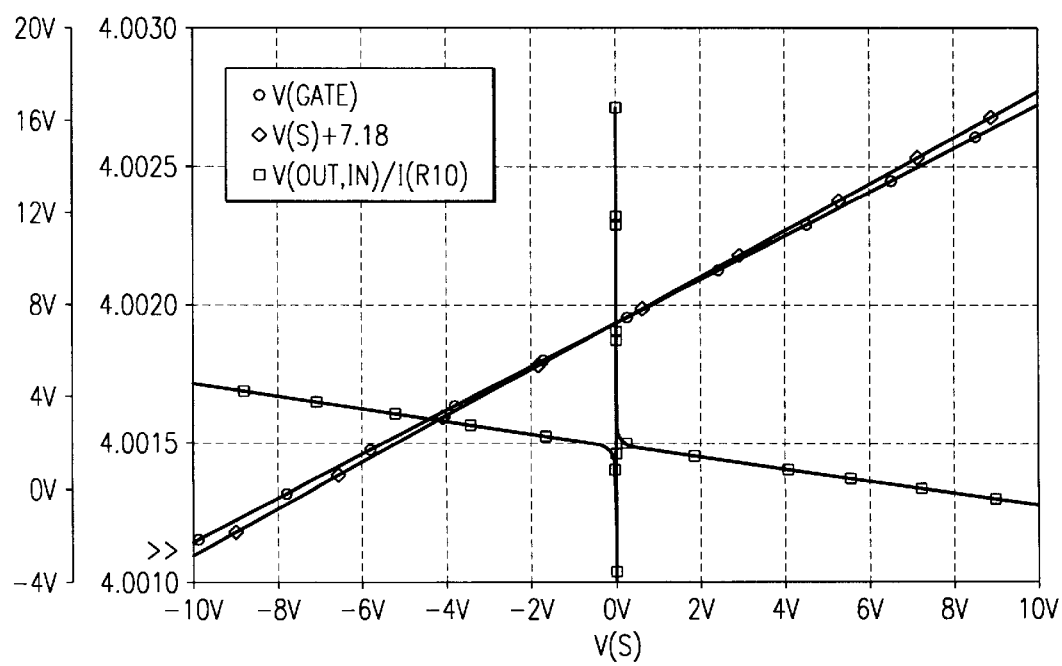
FIG. 5 is a diagram of a typical response of the circuit of FIG. 4.

FIG. 5 is a diagram of a typical response of the circuit of FIG. 4. As shown, FIG. 5 plots the voltage of the gate of transistor 30, the source of transistor 30 and the resistance across the channel of transistor 30. As can be seen, due to the compensation of the gate voltage, the slope of the resistance is relatively small (i.e., the resistance is substantially uniform). Further, this slope can be adjusted by changing the value of resistor R23 of FIG. 4. Further, the value of the resistance at zero volts input signal can be adjusted with the offset voltage. It should be noted that, in the diagram of FIG. 5, the plot excursion at zero volts is an artifact of the mathematical analysis. The passage through zero volts in a physical circuit is actually quite smooth.

Figure 6:
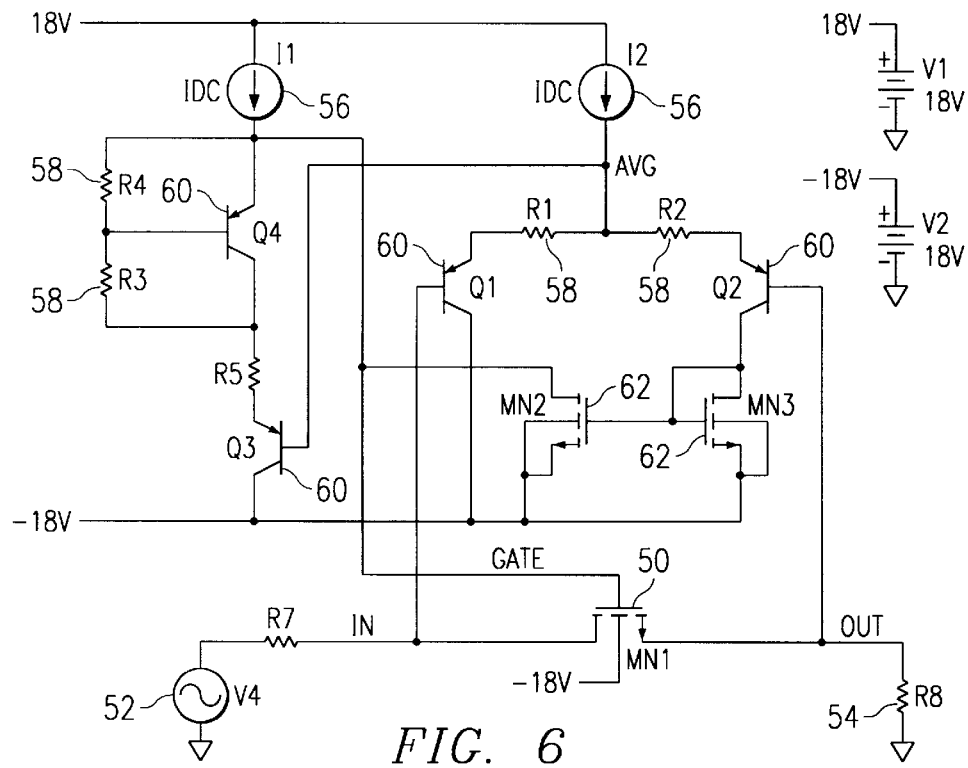
FIG. 6 is a generalized discrete implementation of the circuit of FIG. 4.

FIG. 6 is a generalized discrete monolithically integratable implementation of the circuit of FIG. 4. As shown, a transistor device 50 has its source coupled to a voltage signal source 52 and its drain coupled to a node 54. The gate of transistor 50 is connected to circuitry for compensating the gate voltage based upon the input and output voltage signals. As shown, the circuitry includes a pair of current sources 56. Further, this circuitry includes resistors 58, bipolar transistors 60, and transistors 62 connected together as shown. The compensation circuitry formed by these elements operates to compensate the gate voltage of transistor 50 to produce a more uniform channel resistance response across a range of input signals from voltage source 52.

Figure 7:
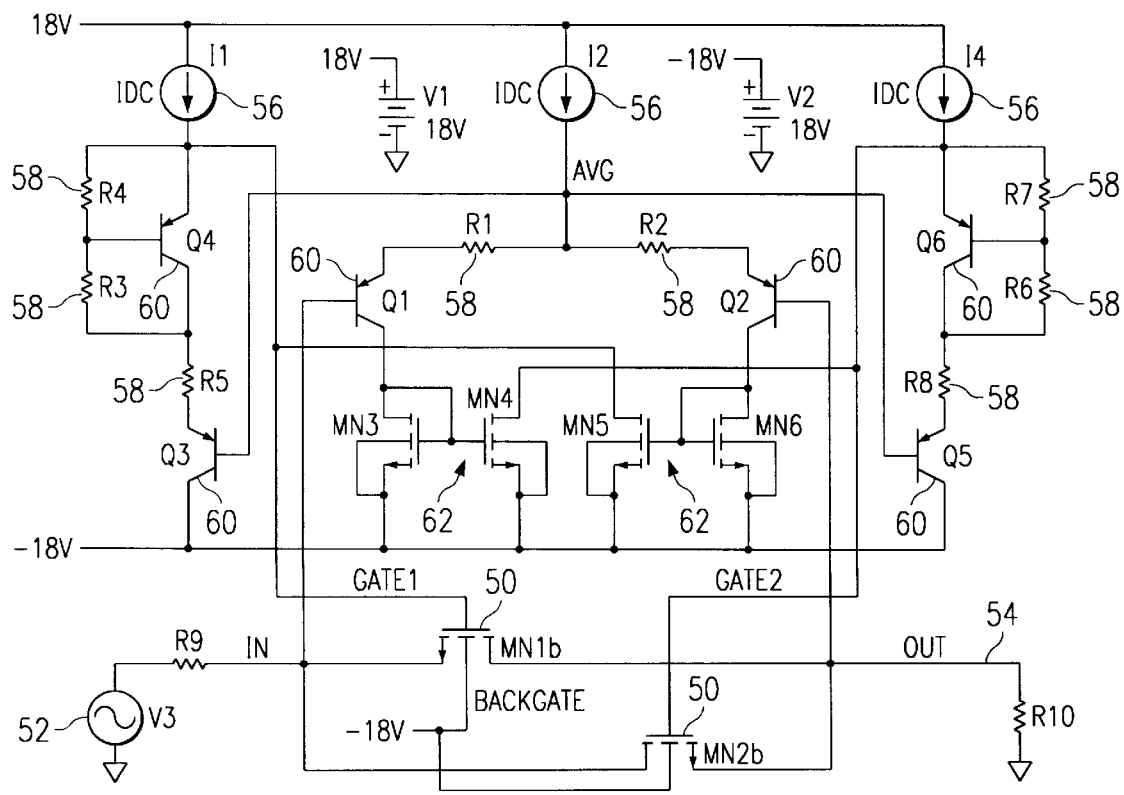
FIG. 7 is a circuit diagram of one embodiment of a bi-directional compensated switch device using the circuit of FIG. 6.

FIG. 7 is a circuit diagram of one embodiment of a bi-directional compensated switch device using the circuit of FIG. 6. As can be seen, the circuit of FIG. 7 duplicates some of the portions of the circuit of FIG. 6 to allow bi-directional compensated operation and to improve symmetry of signals passing either way through the circuit. Otherwise, the circuit of FIG. 7 includes the same elements as that of FIG. 6 and operates in the same manner.

Figure 8:
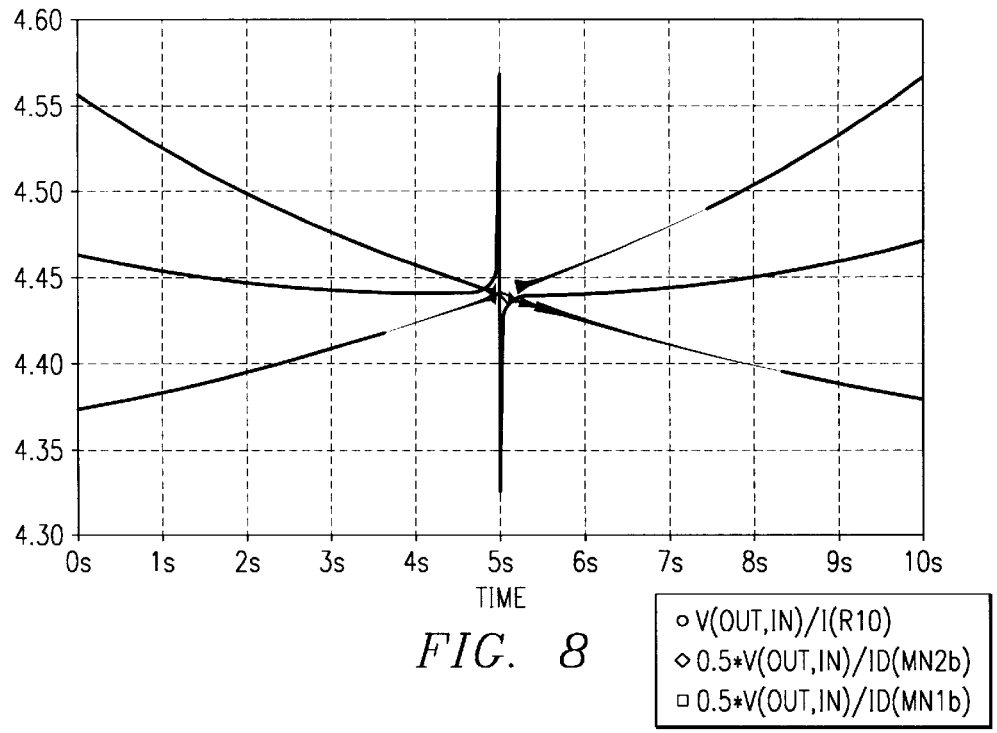
FIG. 8 is a diagram of the typical on-resistance of the circuit of FIG. 7.

FIG. 8 is a diagram of the typical on-resistance of the circuit of FIG. 7. As shown, the total on-resistance for the switch element of the circuit is plotted as well as the on-resistance of each transistor 50. The slopes of the individual transistors 50 are adjusted by varying the size of the differential long-tailed pair current mirror amplifiers feeding the gates of transistors 50. As can be seen, the circuit produces a substantially constant on-resistance for the parallel transistors 50.

Figure 9:
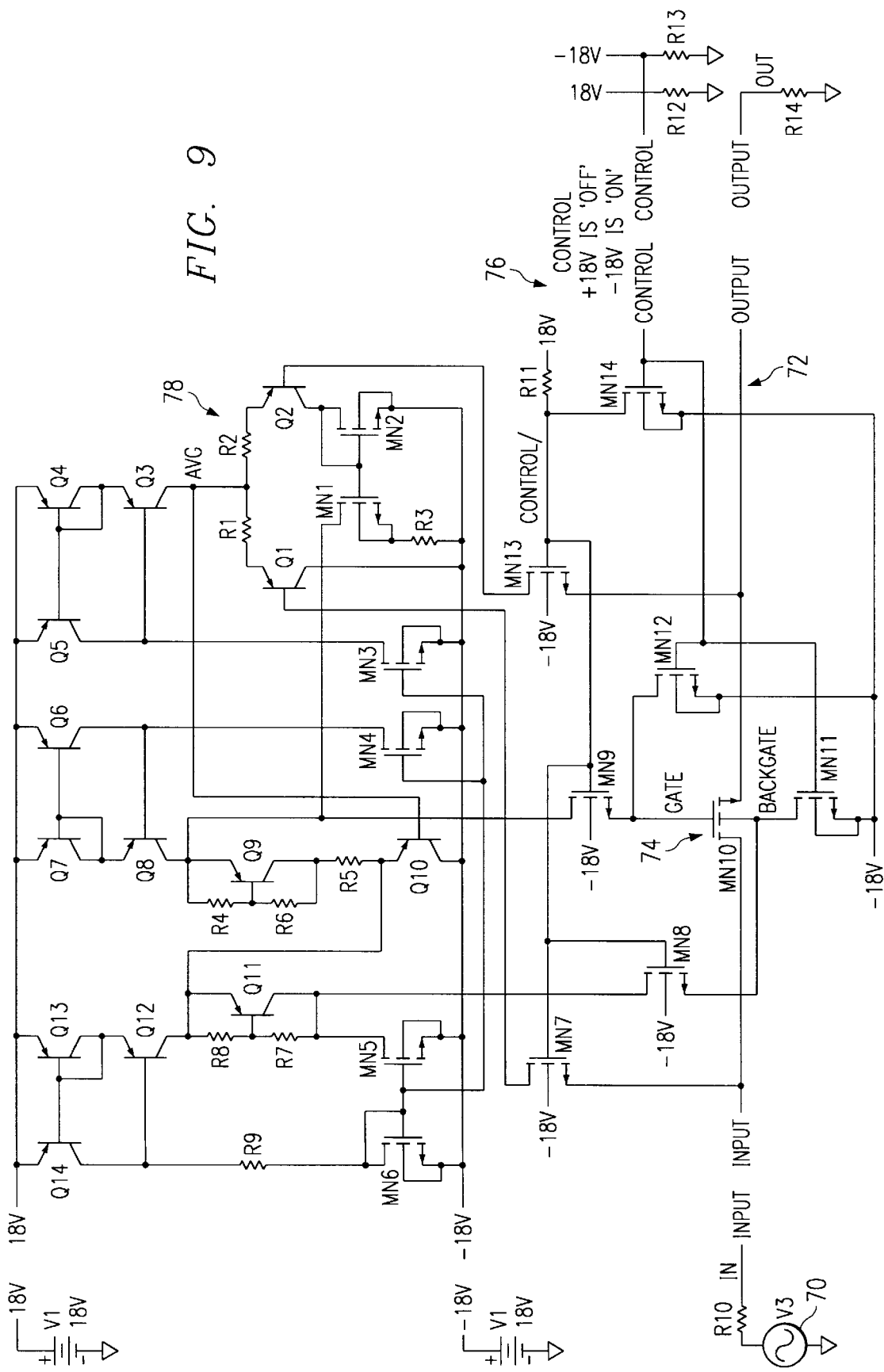
FIG. 9 is a circuit diagram of another embodiment of a field effect transistor switch with backgate linearity compensation.

FIG. 9 is a circuit diagram of another embodiment of a field effect transistor switch with backgate linearity compensation. As shown, FIG. 9 has an input signal source 70 and an output 72 coupled to the source and drain of a transistor 74. Transistor 74 has a gate and a backgate both of which are biased by compensation circuitry. The compensation circuitry includes control circuitry 76 and biasing circuitry 78. These circuits are formed by various bipolar transistors, resistors and field effect transistors, as shown.

In the circuit of FIG. 9, the resistor R9 sets the current through transistor Q14 and n-channel MOSFET MN6. The current through Q14 is then mirrored through Q13 and Q12, allowing the voltage at the collector of Q12 to be set by a low impedance driving source. Correspondingly, current through MN6 is mirrored in MN5 allowing the voltage on the drain of MN5 to be set by a low impedance driving source. MN4 mirrors the current through MN6 which in turn supplies collector current to Q6 that is mirrored in Q7/Q8. The Q8 collector voltage is set by a lower impedance driving source. MN3 mirrors the current through MN6 and supplies collector current to Q5 that is mirrored through Q3/Q4. The collector of Q3 then supplies current to the bases of the long-tailed transistor pair Q1/Q2.

In operation, the circuit provides a low resistance signal path through the source/drain channel of transistor 74. In the circuit of FIG. 9, the resistance of the signal path remains substantially constant over the required range of input voltage signals to produce low distortion in the output signal. (Further, it should be noted that, although MOSFETs are shown, the same techniques can actually be used with compensating JFETs and can afford more advantages, such as increased input voltage range, when so used.)

For an "on" state of the signal switching device MN10, transistors MN7, MN8, MN9 and MN13 are biased "on". This means that their source/drain resistance is very low with respect to the current they are required to pass. Hence, there is an insignificant voltage drop across the device. Also in this state, transistors MN11, MN12 are biased "off". This means that a voltage at their source or drain is not affected by a voltage at their drain or source. (Of course, the circuit could be operated in opposite states with these devices in the "off" rather than "on" or "on" rather than "off" states.) With the circuit in this "on" state, in the biasing circuitry 78, the input signal is applied to the base of Q1 and the output signal is applied to the base of Q2. Then, the voltage at the junction of R1 and R2 is the average of the input and output voltage signals. The collector currents of Q1 and Q2 are proportional to the differences of the input and output voltage signals. The average voltage is applied to the base of emitter follower transistor Q10, supplying the average voltage with a base emitter voltage offset at the emitter.

To compensate for higher order non-linearities, the slope of the control voltages can be modified by adding or subtracting a voltage proportional to the difference of the input and output voltages. This is accomplished, for example, by mirroring the collector current of Q2 through MN2 and into MN1. These devices provide a current mirror amplifier as the current gain can be changed by controlling the ratio of the size of MN2 to MN1 and by changing the resistance of R5. The current from MN1 is subtracted from current source Q8. The change in current through resistor R5 caused by the change in the collector current of Q2 causes a voltage change that appears in the gate driving voltage of MN10. The circuit can be placed in the collector of Q1, Q2, or both, as required. Complete vertical mirroring of this circuit and the parallel connection of the two results in further alternatives in reducing distortion.

Transistor Q9, together with resistors R4 and R6, create a VBE multiplier circuit and produces a substantially constant voltage between the emitter and collector of Q9. As the impedance presented by the collector at Q8 is very high (it is a current source), the voltage at the collector of Q9 is the offset average voltage from the differential pair Q1/Q2 that is further offset towards the positive supply rail by the VBE multiplier voltage. This voltage is applied to the base of transistor 74. In the circuit of FIG. 8, Q11, R7 and R8 form another VBE multiplier that offsets the same offset average voltage towards the negative supply rail. The voltage out of this VBE multiplier (the drain voltage of MN5) is applied to the back gate of transistor 74. "Off" operations of the circuit can be obtained by reversing the "on" control transistors to "off" and the "off" transistors to "on." This couples the gate and back gate of transistor 74 to the most negative voltage $V_{EE}$ in the circuit which causes the channel resistance to greatly increase. In operation, device MN14 and R11 form a voltage inverter that supplies the requisite control voltages to the various control switching FETs.

Figure 10A:
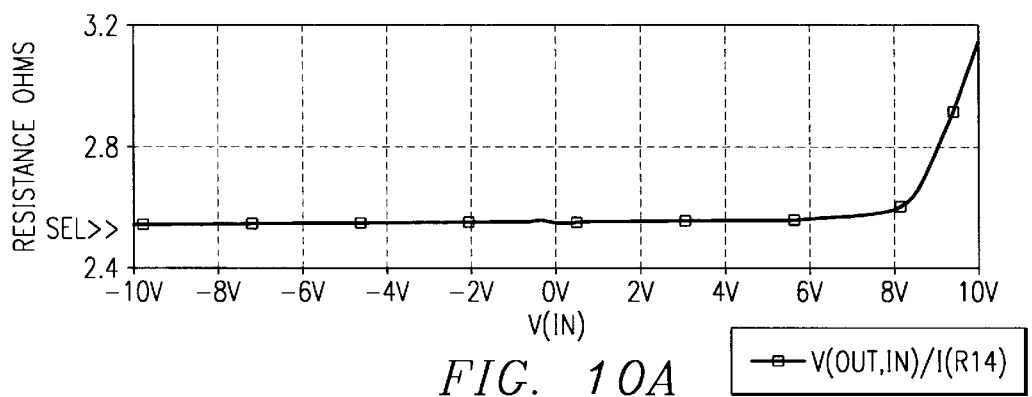
FIG. 10 is a diagram of typical switch voltages and on-resistance of the circuit of FIG. 9.
Figure 10B:
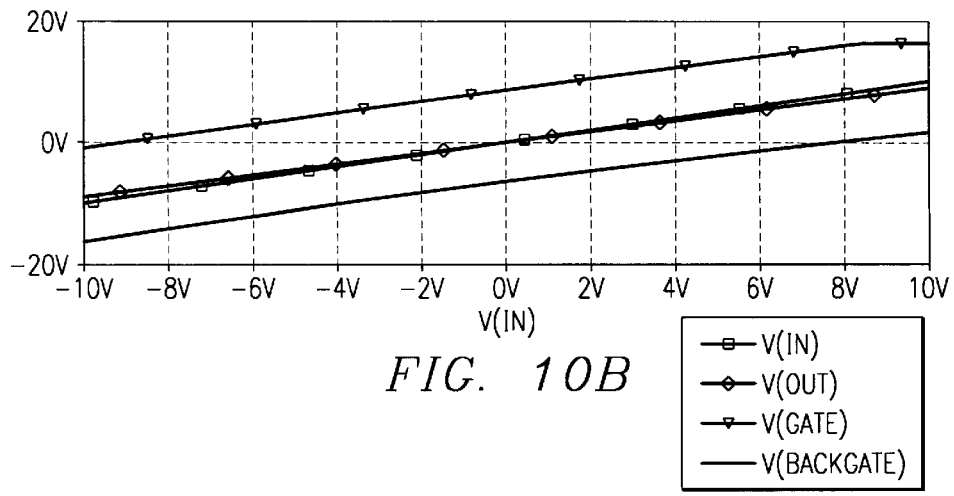

FIG. 10 is a diagram of typical switch voltages and on-resistance of the circuit of FIG. 9. As shown, the values of various voltages within FIG. 9 are plotted as a function of a swept input voltage signal. The value of the resistance of the switching device is shown in the lower graph. One uniqueness of the FET switch circuit of FIG. 9 is due to the application of voltages to the gate and backgate that track the average of the switch input and output voltages but are offset by constant voltage magnitudes. The gate is offset to decrease the FET channel resistance. The backgate is offset in the direction required to back bias the backgate/channel semiconductor junction.

In operation, the application of the tracking voltage to the gate is a primary contributor to switch distortion reduction. The backgate bias is a secondary contributor. As should be understood, the compensation methods can be used together or separately. Additionally, a voltage proportional to the difference of the input and output voltages can be added to or subtracted from the gate and back gate voltages to compensate for unequal source and drain contact resistances in the switching transistor and for various channel doping profiles. This biasing can be used with the above compensation or separately.

As disclosed, the control gate can generally be made to follow the input signal This works fine for small amounts of current through the field effect transistor switch. However, increased current results in a voltage drop between drain and source. It has been found that, if the device if symmetrical, applying the average of the input and output voltages offset by some value to turn the device "on" results in improved linearity. Further, if the backgate voltage is offset (the substrate in a discrete FET) to a voltage below the average of the output and input voltage, the higher order effects of the back gate on the characteristic curve of the FET is minimized to a large extent.

If the device is non-symmetrical (primarily, drain contact resistance does not equal source contact resistance), or there is a channel doping profile that results in a non-square law FET response, the non-linearity can be largely compensated by adding or subtracting (depending upon the cause of the non-linearity) a small amount of the difference between the input and output signals. This changes the slope of the gate voltage with respect to the applied voltage. Complete symmetry of the topology of the switch (as required to obtain electrical symmetry—indifference to which direction the signal is traveling) can require two pass elements to be placed in parallel and two compensation circuits to be used.

Although the present invention has been described in detail, it should be understood that various changes, substitutions and alterations can be made thereto without departing from the spirit and scope of the invention as defined by the appended claims.

What is claimed is:

1. An electronic switch, comprising
    a bidirectional switch element having two signal terminals and a control terminal, the switch element operable to pass a signal between the signal terminals responsive to a voltage applied to the control terminal; and
    compensation circuitry coupled to the control terminal and the signal terminals, the compensation circuitry applying a bias voltage to the control terminal that tracks an average of a voltage at the signal terminals and is offset by a substantially constant voltage magnitude, wherein the bias voltage comprises the average of the voltage at the signal terminals summed with a voltage difference between the signal terminals;
    the bias voltage insuring a substantially uniform resistance across the switch element as the signal varies.

2. The electronic switch of claim 1, wherein:
    the switch element is a field effect transistor;
    one of the signal terminals is a source of the field effect transistor;
    the other signal terminal is a drain of the field effect transistor;
    the control terminal is a gate of the field effect transistor; and
    the bias voltage offsets the gate to decrease the channel resistance of the field effect transistor.

3. The electronic switch of claim 2, wherein:
    the compensation circuitry is further coupled to a backgate of the field effect transistor and applies a second bias voltage to the backgate that tracks an average of the voltage at the signal terminals and is offset by a substantially constant voltage magnitude;
    the second bias voltage offsetting the backgate to back bias the backgate to channel semiconductor junction.

4. The electronic switch of claim 2, wherein the field effect transistor is a metal oxide semiconductor field effect transistor.

5. The electronic switch of claim 2, wherein the field effect transistor is a junction field effect transistor.

6. The electronic switch of claim 2, wherein the field effect transistor is a metal-semiconductor field effect transistor.

7. An electronic switch, comprising
    a bidirectional switch element having two signal terminals, a control terminal and a backgate, the switch element operable to pass a signal between the signal terminals responsive to a voltage applied to the control terminal; and
    compensation circuitry coupled to the signal terminals and the backgate, the compensation circuitry applying a bias voltage to the backgate that tracks an average of the voltage at the signal terminals and is offset by a substantially constant voltage magnitude;
    the bias voltage offsetting the backgate to back bias the backgate to channel semiconductor junction.

8. The electronic switch of claim 7, wherein the bias voltage comprises the average of the voltage at the signal terminals summed with a voltage difference between the signal terminals.

9. The electronic switch of claim 7, wherein:
    the switch element is a field effect transistor;
    one of the signal terminals is a source of the field effect transistor; and
    the other signal terminal is a drain of the field effect transistor.

10. The electronic switch of claim 7, wherein:
    the compensation circuitry is further coupled to the control terminal, the compensation circuitry applying a second bias voltage to the control terminal that tracks an average of a voltage at the signal terminals and is offset by a substantially constant voltage magnitude;
    the second bias voltage insuring a substantially uniform resistance across the switch element as the signal varies.

11. The electronic switch of claim 9, wherein the field effect transistor is a metal oxide semiconductor field effect transistor.

12. The electronic switch of claim 9, wherein the field effect transistor is a junction field effect transistor.

13. The electronic switch of claim 9, wherein the field effect transistor is a metal-semiconductor field effect transistor.

* * * * *